United States Patent [19]

Kober et al.

[11] 4,172,317

[45] Oct. 30, 1979

[54] IC INSERTION HAND TOOL

[75] Inventors: Marvin Kober, Spring Valley; Thomas Rivera, New York, both of N.Y.

[73] Assignee: O.K. Machine and Tool Corporation, New York, N.Y.

[21] Appl. No.: 912,354

[22] Filed: Jun. 5, 1978

[51] Int. Cl.² .............................................. H05K 3/32
[52] U.S. Cl. ...................................... 29/566; 29/741; 29/758; 140/147
[58] Field of Search ................. 29/741, 566, 758, 764, 29/626; 140/147

[56] References Cited

U.S. PATENT DOCUMENTS

| | | | |
|---|---|---|---|
| 3,535,763 | 10/1970 | Helton | 29/741 |
| 3,599,309 | 8/1971 | Mulligan | 29/764 |
| 3,896,533 | 7/1975 | Ullman et al. | 29/741 X |

*Primary Examiner*—Carl E. Hall

[57] ABSTRACT

A hand tool for inserting a MOS integrated circuit into a socket is described. The tool is characterized by a handle having at one end gripping means operative with a collet-like action for receiving the MOS IC. A rotatable sleeve on the handle opens and closes the gripping means, and further means are provided on the handle to eject the IC. The tool is mainly of plastic, with a conductive surface, and means are provided for electrically grounding the tool to avoid damaging the IC.

8 Claims, 9 Drawing Figures

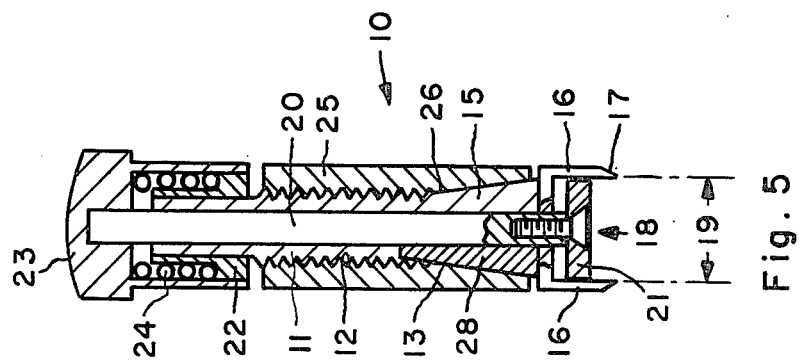
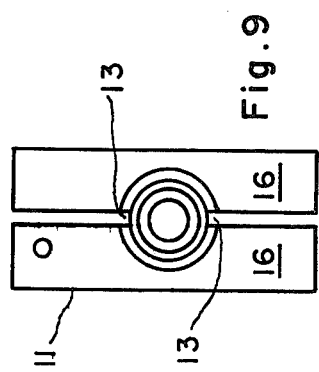
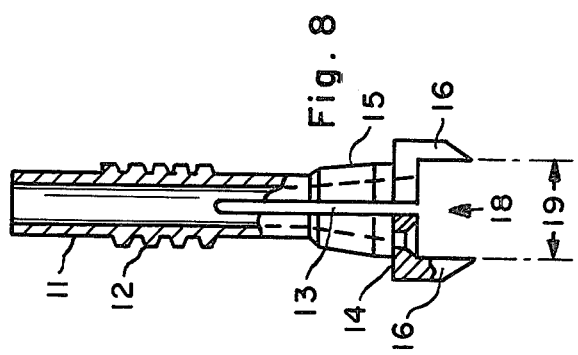
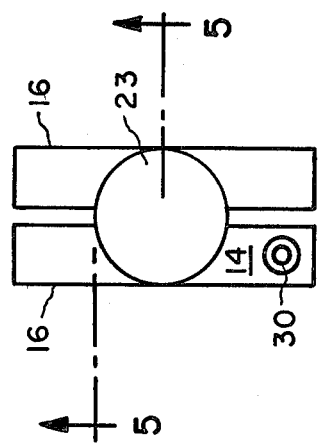
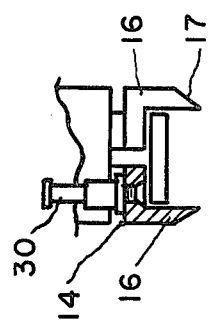

IC INSERTION HAND TOOL

This invention relates to a hand tool for inserting a MOS IC in a socket.

Reference is made to a related commonly assigned patent application, Ser. No. 813,270, filed July 6, 1977, now U.S. Pat. No. 4,100,670. This related patent application, whose contents are hereby incorporated by reference, describes a hand tool for inserting an integrated circuit (IC) of the dual-in-line package type into a socket. The tool there described features automatic ejection of the IC as it is plugged into the socket, and is most effective with IC packages containing 14 or 16 pins.

ICs of the metal-oxide-semiconductor (MOS) type or of the CMOS type differ from other ICs, such as of the TTL type, in that they are more susceptible to damage due to inadvertent electric charge. In addition, some of such ICs employ 36 and 40 pin dual-in-line packages. The more pins on the package, the more difficult it is to insert the package in the socket.

One object of the invention is a novel IC insertion tool especially adapted for MOS ICs.

Another object of the invention is a novel insertion tool especially adapted for inserting into a socket 36 and 40 pin dual-in-line IC packages.

Still a further object of the invention is an insertion tool capable of low cost manufacture.

Briefly speaking, the novel IC insertion tool of the invention comprises a handle having at one end gripping means operative by collet-like action to hold the IC in a cavity and set the pins to the proper inserting dimension. A rotatable sleeve on the handle, when actuated, causes opening and closing of the gripping means. A plunger is mounted on the handle to eject from the cavity the IC during insertion in its socket. The surface of the tool where it holds the IC is electrically conductive, and means are provided to electrically ground the tool and thus the IC during handling to prevent the inadvertent build up of undesired electrical charge.

The invention will now be described in greater detail with respect to one exemplary embodiment thereof, reference being had to the annexed drawings wherein:

FIG. 5 is a longitudinal, partly cross-sectional view of the tool of FIGS. 1-4 along the line 5—5 of FIG. 6;

FIG. 6 is a top view of the tool of FIG. 5;

FIG. 7 is a detail view showing construction of the wire terminal;

FIG. 8 is a partly cross-sectional view of the main body part of the tool of FIG. 1;

FIG. 9 is a top view of the body part shown in FIG. 8.

Figure 1:
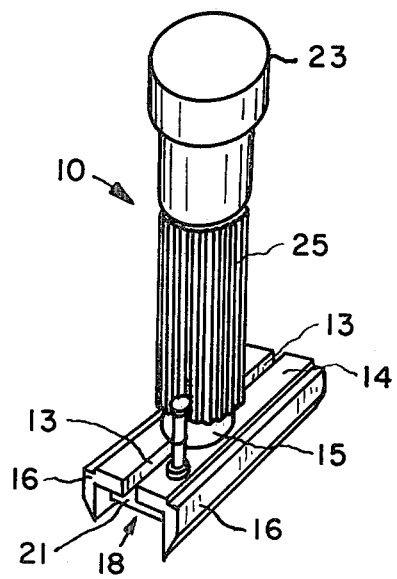
FIGS. 1-4 are perspective views of one form of tool in accordance with the invention showing its use during insertion of an IC into a socket.
Figure 2:
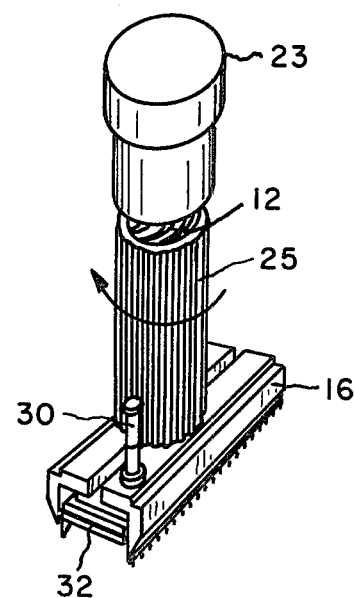

One embodiment of a tool according to the invention is illustrated in FIGS. 5-9. It comprises an elongated handle 10 comprising a hollow main body or housing part 11 which is generally of cylindrical configuration with a threaded portion 12 generally at its center. The housing part 11 is split at its lower portion forming aligned longitudinal slots 13. The lower portion also has a tapered conical section 15 adjacent the slots 13. The tapered section 15 terminates at a flat shoulder portion 14 from which depend and project downward opposed gripping members 16. The gripping members 16, whose ends are tapered at 17 to improve visibility, define a U-shaped cavity 18 for receiving the IC package. The inside spacing between the inside surfaces of the gripping members, designated 19 in FIG. 5, is chosen to match the width across the package pins when aligned with the socket holes.

Extending lengthwise through the housing part 11 is a hole, and located within the hole is a shaft 20. Connected to the bottom of the shaft 20, as by a screw, is an ejecting plate 21 which is movable axially within the cavity 18. Secured to the top of the housing 11 is a spring retainer 22. Secured to the top of the shaft 20 is a plunger top 23. A compression spring 24 seats between the spring retainer 22 and the inside of the plunger top 23. The spring 24 biases the plunger top 23 outwardly until the ejecting plate 21 hits the cavity bottom, and acts to provide an upward restoring force after the plunger top 23 has been pushed downward (FIGS. 1-4) to actuate the ejector plate 21 and then released.

A rotatable sleeve member 25 threadingly engages the threaded portion 12 of the housing 11. The sleeve 25 has a tapered section 26 at its bottom complementary to that of the housing tapered section 15 and engages it. In FIG. 5, the sleeve is shown at a position approximately midway between open and closed positions. Located within each of the slots 13 is a wedge-shaped shim member 28, only one of which is shown in FIG. 5. The thickness of the shim member 28 substantially matches the width of the slot 13 in which it is located. The slot width is the horizontal dimension in FIG. 8.

A terminal member 30 is mounted on the shoulder 14 of the housing part 11, as by a screw as shown in FIG. 7. The terminal 30 is configured at its top to receive a conventional banana type electrical plug or an alligator clip (not shown) to which a wire can be connected and then grounded to the chassis or PCB holding the socket which is to receive the IC. With the exception of the terminal, the screws shown, the shaft and the ejecting plate, which are of metal, the remaining parts of the tool are of plastic provided with an electrically conductive surface, obtained for example by electroplating the plastic with a metal such as chromium.

Figure 3:
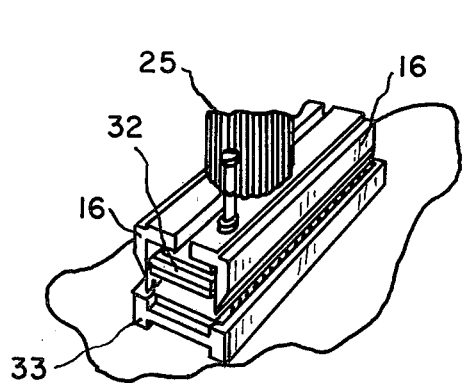
Figure 4:
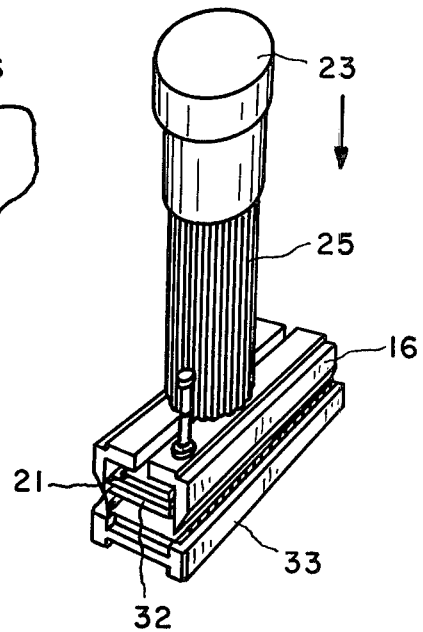

Operation of the tool will now be described with reference to FIGS. 1-4. FIG. 1 shows the tool with the sleeve 25 rotated CCW to occupy its uppermost or open position. In this position, the gripping members 16 are wide open. After connecting a wire to the terminal 30 and grounding the wire, which is not shown for the sake of clarity, the tool is then placed over an IC 32, standing on its pins on a supporting surface, and then while holding the sleeve is pressed down over the IC. The IC 32 enters the cavity 18, its normally outwardly bent pins engaging the electrically-conductive side surfaces of the gripping members 16. Then the sleeve 25 is rotated CW until tight, illustrated in FIG. 2. The downward displacement of the sleeve 25 causes its tapered surface 26 to cam inward the engaged tapered surface 15 on the housing part 11, displacing the gripping members 16 toward one another. This collet-like action tightens the gripping members on the IC sides bending its pins inward to the required spacing needed to align the pins with the socket holes. The gripped IC 32 with its pins projecting downward is next positioned over the socket 33, the pins aligned with the socket holes, and then pressed against the socket as shown in FIG. 3. Next, while holding the sleeve, the plunger top 23 is pressed downward, actuating vertically the ejecting plate 21 which pushes the IC out of the cavity and simultaneously inserts the IC into its socket, illustrated in FIG. 4.

In a typical socket for receiving a 40 pin dual-in-line IC, the center-to-center spacing between the parallel rows of socket holes is 0.600 inches. The construction of the tool is designed to provide a spacing between the gripping means, designated as 19 in FIG. 5, due to natural spring or resiliency of the plastic resin constituting the split cylinder, of about 0.610 inches. However, when the rotating sleeve 25 is in its outermost or open position, the gripping means due to bowing of its resilient body can be displaced outwardly to about 0.630 inches and even to about 0.700 if needed to receive an IC whose pins may be bent outwardly. When the sleeve is rotated to its innermost or closed position, the spacing 19 is reduced to 0.610 inches which will firmly grip the IC along its pin sides thereby displacing or setting them inward to assume the desired positions which will be aligned with the parallel rows of socket holes for receiving them. The two shims 28 located in the two slots 13 in the split cylindrical member 11 have the required thickness, 0.058 inches for the example given, to assure that the gripping member spacing 19 is the required 0.610 inches when the sleeve is tightened to its closed position. If the shims 28 were not present, due to the limited stiffness of the plastic split cylinder, tightening of the sleeve would cause the upper part of the cylinder to bend inwardly, in turn causing the gripping members to bend outwardly, resulting in inadequate holding of the IC or inadequate bending of the IC pins to the required center-to-center socket hole spacing. The shims thus act to prevent collapse of the slots due to the outward pressure exerted by the IC pins on the gripping members.

Among the features that contribute to the low cost manufacture of the tool of the invention is maximum use of molded plastic material. A number of resin molding compounds are available and usable for fabricating the various parts that make up the tool. The required characteristics are easy moldability, reasonable toughness and impact strength, some resilience in thin-walled members, especially for the housing member with the split body portion, good dimensional stability because of the close tolerances required, and the ability to be metallized or electroplated to form the desired electrically conductive surface. We have found ABS (acrylonitrite, butadiene, styrene) thermoplastic polymers, plating-grade, which are commercially available from a number of suppliers, to be suitable for this application. In using such materials to fabricate the various tool parts, such as the split cylinder 11, the plunger top 23, the spring retainer 22, the sleeve 25, and the shims 28, best results are obtained when the wall thickness of each separate part is maintained reasonably uniform. Thus, selecting a suitable wall thickness for the split hub at the area designated 15 to provide the small flexure needed leads to a widening of the hole at the center as it progresses downward through the tapered section to maintain the wall thickness reasonably uniform. However, during the clamping action, rotation of the sleeve to its closed position has a tendency to cause the split tapered section to bow outwardly, which could interfere with rotation of the sleeve. This is avoided by use of the shim inserts 28, located in the slots 13. These shim inserts limit the inward motion of the housing lower portion 15 and thus avoid the undesired bowing of that piece. Construction of the plunger top 23 can be similarly modified to simplify molding. Thus, grooves can be provided on the inside of the plunger top wall to remove material and thus provide a wall thickness at the top that is closer to the wall thickness along its sides.

Flats (not shown) can also be provided at opposite sides of the threaded portion 12 of the housing part 11, to eliminate the threads at those locations and avoid distortion in the thread configuration that might otherwise occur due to excess plastic remaining at the mold parting line. Such distortion could interfere with rotation of the sleeve.

While any coarse thread could be used to reduce the rotation required for the sleeve to traverse its path from its open to its closed position, we prefer to use a four-leaf thread, which is easy to mold into the part, and allows the required movement of the sleeve to be achieved with only one-half revolution.

As will be evident from the foregoing, a relatively simple, sturdy, low cost tool results capable of easy use for inserting an IC into a socket. The construction described ensures proper alignment of the many pins of a 36 or 40 pinned package with the socket holes allowing for rapid IC insertion. The grounding means shown ensures no undesired build up of electric charge due to handling of a MOS IC thus preventing charge damage thereto.

The tool of the invention while specifically adapted for dual-in-line MOS ICs, is also applicable to any multi-pinned electrical component that requires the assistance of tool holding to facilitate insertion into a socket.

While our invention has been described in connection with a specific embodiment thereof, those skilled in the art will recognize that various modifications are possible within the principles enunciated herein and thus the present invention is not to be limited to the specific embodiment disclosed.

We claim:

1. An insertion tool for an IC electrical component having projecting pins, comprising a handle portion having an electrical component gripping end, said gripping end comprising means for gripping the sides of the electrical component and forming a cavity for receiving the gripped electrical component with its pins projecting outwardly, said side gripping means comprising a cylindrical member whose lower portion is split forming a pair of opposed gripping members projecting forwardly from the tool end and spaced apart a distance substantially equal to the pin spacing across the electrical component, said opposed gripping members being resiliently urged outwardly and being inwardly displaceable, means on the handle operatively connected to the side gripping means for selectively displacing same inwardly and comprising a rotatable sleeve on the handle and means operatively connecting the sleeve to the said cylindrical member for camming its gripping members inwardly when the sleeve is rotated to a closed position, and means on the handle for ejecting the gripped electrical component from the cavity.

2. An insertion tool as claimed in claim 1, wherein the electrical component is an IC having 36 and 40 dual-in-line pins.

3. An insertion tool as claimed in claim 2, wherein the ejecting means comprises a plunger extending lengthwise through the tool to the cavity for ejecting the IC when the gripping members are in their closed position.

4. An insertion tool as claimed in claim 2, and further comprising shims mounted in the openings formed by the split cylinder lower portion, said shims functioning to define the minimum spacing between the gripping members when the latter are cammed into their closed position by the rotated sleeve.

5. An insertion tool as claimed in claim 4, wherein the tool handle and gripping members are constituted of a plastic resin coated with an electrically conductive material, and means are provided on the handle and electrically connected to its conductive coating for receiving a grounding wire.

6. An insertion tool for an IC electrical component having along opposed sides parallel rows of projecting pins, comprising a handle portion having an electrical component gripping end, said gripping end comprising means for gripping only the pin-containing, opposed sides of the electrical component and forming a cavity for receiving the gripped electrical component with its pins projecting outwardly, said side gripping means being resiliently urged outwardly and being inwardly displaceable, means on the handle operatively connected to the side gripping means for selectively displacing same inwardly in order to grip the pin sides of the electrical component when the latter is located in the cavity and to set the gripped pin rows to a desired inserting dimension, and means on the handle for ejecting the electrical component from the cavity while it is being gripped along the pin sides and the pin rows maintained in the desired inserting dimension.

7. An insertion tool as claimed in claim 6 wherein the IC is of the MOS type and the said side gripping means has an electrically conductive surface, and means are provided on the tool for electrically grounding the said electrically conductive surface of the side gripping means.

8. An insertion tool as claimed in claim 6 wherein the gripping means comprises a cylindrical member whose lower portion is split forming a pair of opposed gripping members projecting forwardly from the tool end and spaced apart a distance substantially equal to the pin spacing across the electrical component, and said selectively displacing means comprises a rotatable sleeve on the handle and means operatively connecting the sleeve to the said cylindrical member for camming its gripping members inwardly when the sleeve is rotated to a closed position.

* * * * *